(12) United States Patent
Wu et al.

(10) Patent No.: US 12,156,325 B2
(45) Date of Patent: Nov. 26, 2024

(54) PACKAGE CARRIER WITH IMPROVED HEAT DISSIPATION EFFICIENCY AND MANUFACTURING METHOD THEREOF

(71) Applicant: Unimicron Technology Corp., Taoyuan (TW)

(72) Inventors: Ming-Hao Wu, Taoyuan (TW); Hsuan-Wei Chen, New Taipei (TW); Chi-Chun Po, New Taipei (TW)

(73) Assignee: Unimicron Technology Corp., Taoyuan (TW)

( * ) Notice: Subject to any disclaimer, the term of this patent is extended or adjusted under 35 U.S.C. 154(b) by 638 days.

(21) Appl. No.: 17/137,293

(22) Filed: Dec. 29, 2020

(65) Prior Publication Data

US 2022/0159824 A1    May 19, 2022

(30) Foreign Application Priority Data

Nov. 19, 2020   (TW) ................. 109140431

(51) Int. Cl.

| | |
|---|---|
| *H05K 1/02* | (2006.01) |
| *H01L 21/48* | (2006.01) |
| *H01L 23/498* | (2006.01) |
| *H05K 1/11* | (2006.01) |
| *H05K 3/00* | (2006.01) |
| *H05K 3/42* | (2006.01) |
| *H05K 3/46* | (2006.01) |

(52) U.S. Cl.
CPC ....... *H05K 1/0206* (2013.01); *H01L 21/4853* (2013.01); *H01L 21/4857* (2013.01); *H01L 21/486* (2013.01); *H01L 23/49822* (2013.01); *H01L 23/49838* (2013.01); *H05K 1/116* (2013.01); *H05K 3/0094* (2013.01); *H05K 3/421* (2013.01); *H05K 3/429* (2013.01); *H05K 3/4679* (2013.01)

(58) Field of Classification Search
CPC ...... H05K 3/0094; H05K 3/421; H05K 3/429; H05K 3/4679; H05K 1/0206; H05K 1/116; H01L 21/4853; H01L 21/4857; H01L 21/486; H01L 23/49822; H01L 23/49838
See application file for complete search history.

(56) References Cited

U.S. PATENT DOCUMENTS

| | | | | |
|---|---|---|---|---|
| 6,101,094 A | * | 8/2000 | Kermaani | H05K 1/141 257/713 |
| 2015/0366102 A1 | * | 12/2015 | Ishihara | H05K 1/0207 29/829 |
| 2016/0007469 A1 | * | 1/2016 | Fu | H05K 1/185 29/841 |

FOREIGN PATENT DOCUMENTS

| | | |
|---|---|---|
| TW | 511409 | 11/2002 |
| TW | I429348 | 3/2014 |

* cited by examiner

*Primary Examiner* — Monica D Harrison
*Assistant Examiner* — Christopher A Culbert
(74) *Attorney, Agent, or Firm* — JCIPRNET

(57) ABSTRACT

A package carrier includes a circuit structure layer and a heat-conducting element. The circuit structure layer includes a notch portion. The heat-conducting element includes a first heat-conducting portion and a second heat-conducting portion vertically connected to the first heat-conducting portion. The notch portion exposes the first heat-conducting portion, and an outer surface of the second heat-conduction portion is aligned with a side surface of the circuit structure layer.

8 Claims, 10 Drawing Sheets

PACKAGE CARRIER WITH IMPROVED HEAT DISSIPATION EFFICIENCY AND MANUFACTURING METHOD THEREOF

CROSS-REFERENCE TO RELATED APPLICATION

This application claims the priority benefit of Taiwan application serial no. 109140431, filed on Nov. 19, 2020. The entirety of the above-mentioned patent application is hereby incorporated by reference herein and made a part of this specification.

BACKGROUND

Field of the Disclosure

The disclosure relates to a semiconductor structure and a manufacturing method thereof, and more particularly to a package carrier and a manufacturing method thereof.

Description of Related Art

In an every layer interconnection count (ELIC) circuit board structure, it is difficult for the circuit layer to have heat dissipation or heat-conducting effects. In order to solve the above-mentioned problem, currently, the heat source is dissipated in a vertical direction (i.e., Z direction) through the methods of 1.) forming thermal pads/bars/x-vias by means of copper electroplating; 2.) embedding copper blocks; and 3.) adopting metal cores. Among the above methods, in the method of forming thermal pads/bars/x-vias by means of copper electroplating, the size of the heat-conducting path is limited by the electroplating ability. Furthermore, embedding copper blocks works based on the theory of conducting heat to the vertical direction through the copper blocks, which is not suitable for a structure in which the thickness of interlayer is too thin. Additionally, in the case of using metal as the material for core layer, although it is possible to achieve heat conduction in horizontal direction, it is required to use blind vias to conduct the heat source to the metal core in the lower layer, which is an indirect contact heat conduction. That is to say, for the multilayer board structure, the vertical heat-conducting path will be blocked by other layers and it is difficult to establish a large-area contact with the outside. Accordingly, the heat source will be limited to the center of the board, resulting in limited heat dissipation.

SUMMARY OF THE DISCLOSURE

The disclosure provides a package carrier, which achieves an improved heat-conducting effect.

The disclosure further provides a manufacturing method of a package carrier, which serves to manufacture the above-mentioned package carrier, and can achieve an improved heat-conducting effect.

A package carrier of the disclosure includes a circuit structure layer and a heat-conducting element, a heat-generating element and a package adhesive. The circuit structure layer includes a notch portion. The heat-conducting element includes a first heat-conducting portion and a second heat-conducting portion perpendicularly connected to the first heat-conducting portion. The notch portion exposes the first heat-conducting portion, and an outer surface of the second heat-conduction portion is aligned with a side surface of the circuit structure layer.

In an embodiment of the disclosure, the circuit structure layer includes a circuit substrate. The circuit substrate includes a core layer, a first inner circuit layer, a second inner circuit layer, a first dielectric layer, a first circuit layer, at least one first conductive blind via, a second dielectric layer, a second circuit layer and at least one second conductive blind via. The first inner circuit layer is configured on one side of the core layer. The second inner circuit layer is configured on the other side of the core layer. The first dielectric layer covers the first inner circuit layer. The first circuit layer is disposed on the first dielectric layer. The first circuit layer is electrically connected to the first inner circuit layer through the first conductive blind via. The second dielectric layer covers the second inner circuit layer. The second circuit layer is disposed on the second dielectric layer. The second circuit layer is electrically connected to the second inner circuit layer through the second conductive blind via.

In an embodiment of the disclosure, the first heat-conducting portion of the heat-conducting element and the first circuit layer are located on the same plane.

In an embodiment of the disclosure, the first heat-conducting portion of the heat-conducting element directly contacts the first circuit layer.

In an embodiment of the disclosure, the circuit structure layer further includes a first build-up structure and a second build-up structure. The first build-up structure is disposed on the first circuit layer of the circuit substrate and is electrically connected to the first circuit layer, wherein the first build-up structure includes a notch portion. The second build-up structure is arranged on the second circuit layer of the circuit substrate and is electrically connected to the second circuit layer.

In an embodiment of the disclosure, the first build-up structure includes at least one dielectric layer, at least one circuit layer, and at least one conductive blind via. The dielectric layer is located between the circuit layer and the first circuit layer, and the circuit layer is electrically connected to the first circuit layer through the conductive blind via.

In an embodiment of the disclosure, the second build-up structure includes at least one dielectric layer, at least one circuit layer, and at least one conductive blind via. The dielectric layer is located between the circuit layer and the second circuit layer, and the circuit layer is electrically connected to the second circuit layer through the conductive blind via.

In an embodiment of the disclosure, the circuit structure layer further includes a first insulating protection layer and a second insulating protection layer. The first insulating protection layer is disposed on the first build-up structure and exposes part of the first build-up structure. The second insulating protection layer is disposed on the second build-up structure and exposes part of the second build-up structure.

In an embodiment of the disclosure, the circuit structure layer further includes a conductive via, which at least penetrates the circuit substrate and is electrically connected to the first circuit layer, the first inner circuit layer, the second inner circuit layer and the second circuit layer.

In an embodiment of the disclosure, the material of the heat-conducting element includes copper, conductive metal adhesive or heat-conducting metal adhesive.

The manufacturing method of the package carrier of the disclosure includes the following steps. A circuit substrate is provided, wherein the circuit substrate has a through via. A heat-conducting material layer is electroplated on the circuit substrate, wherein the heat-conducting material layer covers the inner wall of the through via. A first build-up structure and a second build-up structure are respectively formed on two opposite sides of the circuit substrate. The first build-up structure and the second build-up structure cover the circuit substrate and the heat-conducting material layer, and fill the through via completely. Part of the first build-up structure, part of the circuit substrate, part of the heat-conducting material layer, and part of the second build-up structure are removed to expose the remaining heat-conducting material layer, so as to define a heat-conducting element and form a circuit structure layer including a notch portion. The heat-conducting element includes a first heat-conducting portion and a second heat-conducting portion vertically connected to the first heat-conducting portion. The notch portion exposes the first heat-conducting portion, and an outer surface of the second heat-conducting portion is aligned with a side surface of the circuit structure layer.

In an embodiment of the disclosure, the step of providing a circuit substrate includes the following steps. A core layer, a first inner circuit layer and a second inner circuit layer are provided. The first inner circuit layer and the second inner circuit layer are respectively located on two opposite surfaces of the core layer. A first dielectric layer and a first copper layer located on the first dielectric layer are formed on the first inner circuit layer, and a second dielectric layer and a second copper layer located on the second dielectric layer are formed on the second inner circuit layer. A through via is formed to penetrate the first copper layer, the first dielectric layer, the core layer, the second dielectric layer, and the second copper layer.

In an embodiment of the disclosure, the manufacturing method of the package carrier further includes the following steps. Before the heat-conducting material layer is electroplated on the circuit substrate, at least one first blind via and at least one second blind via are formed to respectively expose part of the first inner circuit layer and part of the second inner circuit layer. When the heat-conducting material layer is electroplated on the circuit substrate, the heat-conducting material layer further covers the first copper layer and the second copper layer, and completely fills the first blind via and the second blind via. A patterning process is performed on the heat-conducting material layer, the first copper layer, and the second copper layer, and a first circuit layer and a second circuit layer are formed on the first dielectric layer and the second dielectric layer, respectively.

In an embodiment of the disclosure, the manufacturing method of the package carrier further includes the following steps. Before the first build-up structure and the second build-up structure are formed on the two opposite sides of the circuit substrate, a release film is arranged on part of the first circuit layer. Part of the first build-up structure, part of the circuit substrate, part of the heat-conducting material layer and part of the second build-up structure are removed by means of routing and lifting off the release film.

In an embodiment of the disclosure, the manufacturing method of the package carrier further includes forming a first insulating protection layer and a second insulating protection layer respectively on the first build-up structure and the second build-up structure before removing part of the first build-up structure, part of the circuit substrate, part of the heat-conducting material layer, and part of the second build-up structure.

The manufacturing method of the package carrier of the disclosure includes the following steps. A circuit substrate is provided. The circuit substrate includes a first copper layer and a recess. The first copper layer has an opening, and the opening communicates with the recess. A heat-conducting material layer is printed on the circuit substrate, wherein the heat-conducting material layer completely fills the recess and the opening, and is connected to the first copper layer. A first build-up structure and a second build-up structure are respectively formed on two opposite sides of the circuit substrate. The first build-up structure and the second build-up structure cover the circuit substrate and the heat-conducting material layer. Part of the first build-up structure, part of the circuit substrate, part of the heat-conducting material layer, and part of the second build-up structure are removed to expose the remaining heat-conducting material layer, so as to define a heat-conducting element and form a circuit structure layer including a notch portion. The heat-conducting element includes a first heat-conducting portion and a second heat-conducting portion vertically connected to the first heat-conducting portion. The notch portion exposes the first heat-conducting portion, and an outer surface of the second heat-conducting portion is aligned with a side surface of the circuit structure layer.

In an embodiment of the disclosure, the step of providing the circuit substrate includes the following steps. A core layer, a first inner circuit layer and a second inner circuit layer are provided. The first inner circuit layer and the second inner circuit layer are respectively located on two opposite surfaces of the core layer. A first dielectric layer and a first copper layer located on the first dielectric layer are formed on the first inner circuit layer, and a second dielectric layer and a second copper layer located on the second dielectric layer are formed on the second inner circuit layer. An opening penetrating the first copper layer and a recess penetrating the first dielectric layer, the core layer and part of the second dielectric layer are formed.

In an embodiment of the disclosure, the manufacturing method of the package carrier further includes: before the first build-up structure and the second build-up structure are formed on the two opposite sides of the circuit substrate, a patterning process is performed on the first copper layer and the second copper layer to form a first circuit layer and a second circuit layer, respectively, and the heat-conducting material layer is connected to the first circuit layer.

In an embodiment of the disclosure, the manufacturing method of the package carrier further includes forming a first insulating protection layer and a second insulating protection layer respectively on the first build-up structure and the second build-up structure before removing part of the first build-up structure, part of the circuit substrate, part of the heat-conducting material layer, and part of the second build-up structure.

In an embodiment of the disclosure, the material of the heat-conducting material layer includes conductive metal adhesive or heat-conducting metal adhesive.

Based on the above, in the package carrier of the disclosure, the heat-conducting element includes a first heat-conducting portion and a second heat-conducting portion vertically connected to the first heat-conducting portion. That is to say, the first heat-conducting portion of the heat-conducting element is embedded in the circuit structure layer, and the second heat-conducting portion is attached to one side of the circuit structure layer and is exposed to the outside environment, which can increase the contact area with the outside environment, and thus making the package carrier of the disclosure to have an improved heat dissipation efficiency.

In order to make the above-mentioned features and advantages of the present disclosure more comprehensible, the following examples are described in detail with reference to the accompanying drawings.

DESCRIPTION OF EMBODIMENTS

Figure 1A:
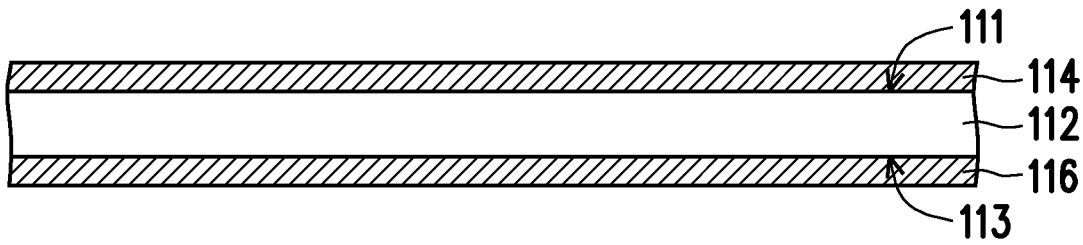
FIG. 1A to FIG. 1I are schematic cross-sectional views of a manufacturing method of a package carrier according to an embodiment of the disclosure.

FIG. 1A to FIG. 1I are schematic cross-sectional views of a manufacturing method of a package carrier according to an embodiment of the disclosure. FIG. 1J and FIG. 1K are schematic cross-sectional views of a manufacturing method for packaging the heat-generating element on the package carrier of FIG. 1I. Regarding the manufacturing method of the package carrier of this embodiment, first, referring to FIG. 1D, a circuit substrate C is provided, wherein the circuit substrate C has a through via T2. In detail, the step of providing the circuit substrate C includes the following steps. First, referring to FIG. 1A, a core layer 112, a first conductive layer 114, and a second conductive layer 116 are provided, wherein the first conductive layer 114 and the second conductive layer 116 are respectively located on two opposite surfaces 111 and 113 of the core layer 112. Under the circumstances, the first conductive layer 114 completely covers the surface 111 of the core layer 112, and the second conductive layer 116 completely covers the surface 113 of the core layer 112.

Figure 1B:
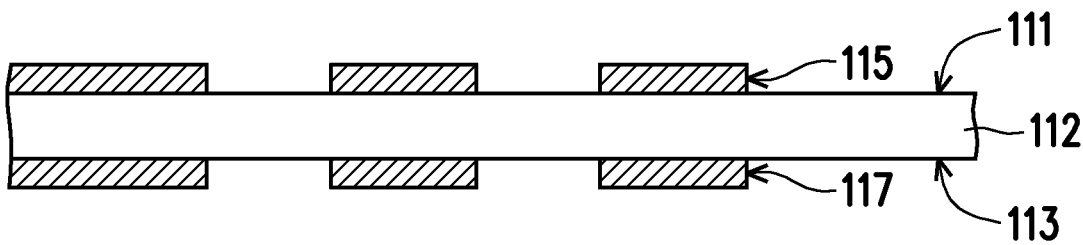

Next, referring to FIG. 1A and FIG. 1B at the same time, a patterning process is performed on the first conductive layer 114 and the second conductive layer 116 to form a first inner circuit layer 115 and a second inner circuit layer 117. Here, the first inner circuit layer 115 is located on the surface 111 of the core layer 112 and exposes part of the surface 111, and the second inner circuit layer 117 is located on the surface 113 of the core layer 112 and exposes part of the surface 113.

Figure 1C:
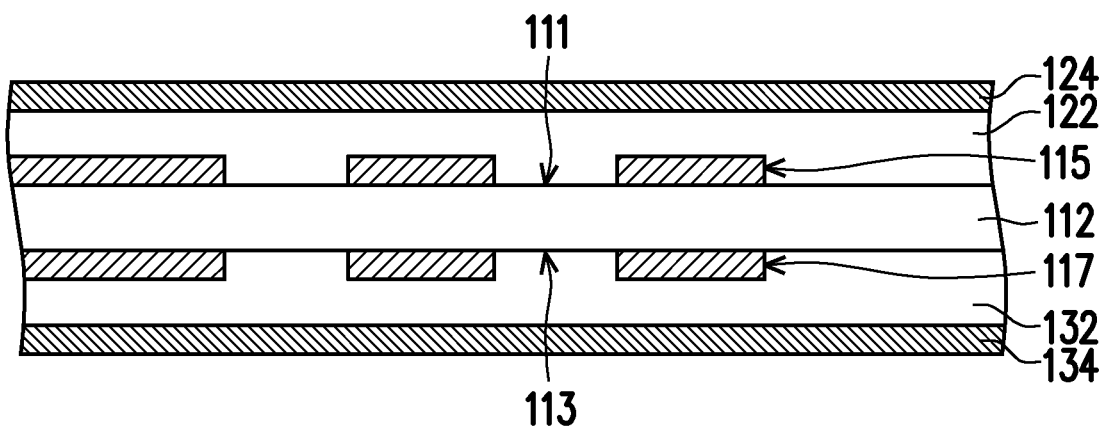

Next, referring to FIG. 1C, by means of lamination, a first dielectric layer 122 and a first copper layer 124 located on the first dielectric layer 122 are formed on the first inner circuit layer 115, and a second dielectric layer 132 and a second copper layer 134 located on the second dielectric layer 132 are formed on the second inner circuit layer 117. The first dielectric layer 122 covers the surface 111 of the core layer 112 and the first inner circuit layer 115, and the first copper layer 124 completely covers the first dielectric layer 122. The second dielectric layer 132 covers the surface 113 of the core layer 112 and the second inner circuit layer 117, and the second copper layer 134 completely covers the second dielectric layer 132.

Figure 1D:
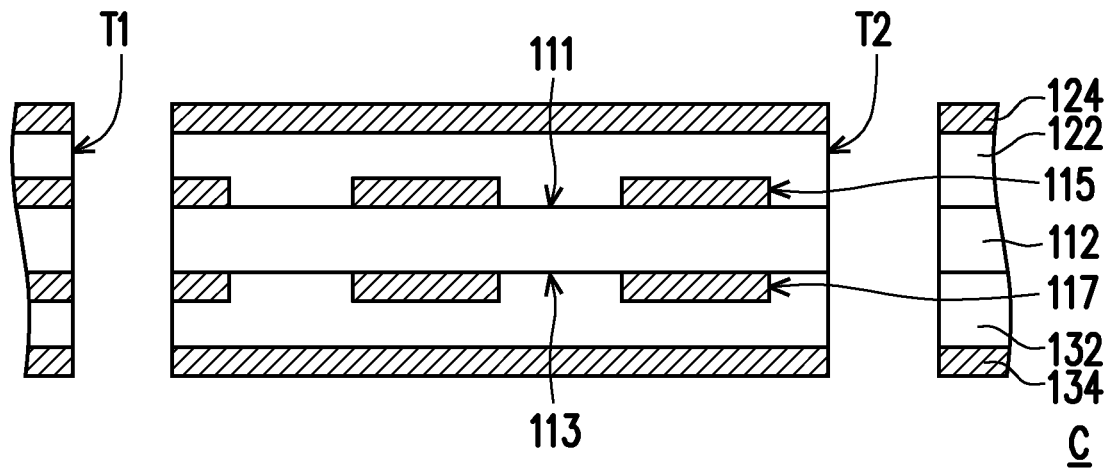

Next, referring to FIG. 1D, a through via T1 penetrating the first copper layer 124, the first dielectric layer 122, the first inner circuit layer 115, the core layer 112, the second inner circuit layer 117, the second dielectric layer 132 and the second copper layer 134 are formed, and a through via T2 penetrating the first copper layer 124, the first dielectric layer 122, the core layer 112, the second dielectric layer 132, and the second copper layer 134 are formed. Here, the method of forming the through vias T1 and T2 is, for example, laser drilling or mechanical drilling, but not limited thereto. At this stage, the production of the circuit substrate C has been completed.

Figure 1E:
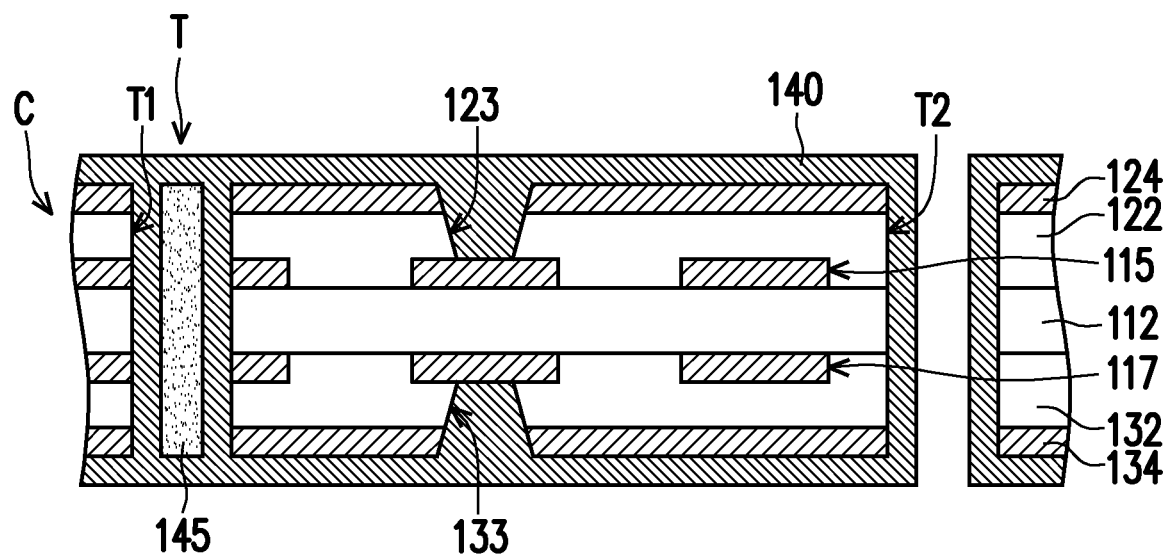

Next, referring to FIG. 1E, a drilling process is performed on the first copper layer 124 and the first dielectric layer 122 as well as the second copper layer 134 and the second dielectric layer 132, so as to form at least one first blind via (a first blind via 123 is shown schematically) and at least one second blind via (a second blind via 133 is shown schematically), thereby exposing part of the first inner circuit layer 115 and part of the second inner circuit layer 117 respectively. Here, the method of forming the first blind via 123 and the second blind via 133 is, for example, laser drilling, but not limited thereto.

Next, further referring to FIG. 1E, a heat-conducting material layer 140 is electroplated on the circuit substrate C, wherein the heat-conducting material layer C covers the inner walls of the through vias T1 and T2, the first copper layer 124, and the second copper layer 134, and completely fills the first blind via 123 and the second blind via 133. Under the circumstances, the resin 145 can also be filled in the through via T1 to define a conductive via T. Here, the through via T2 is not completely filled yet, and only the heat-conducting material layer 140 covers the inner wall of the through via T2, and the material of the heat-conducting material layer 140 is copper, for example. In other words, the material of the heat-conducting material layer 140 can be the same as the material of the first copper layer 124 and the second copper layer 134.

Figure 1F:
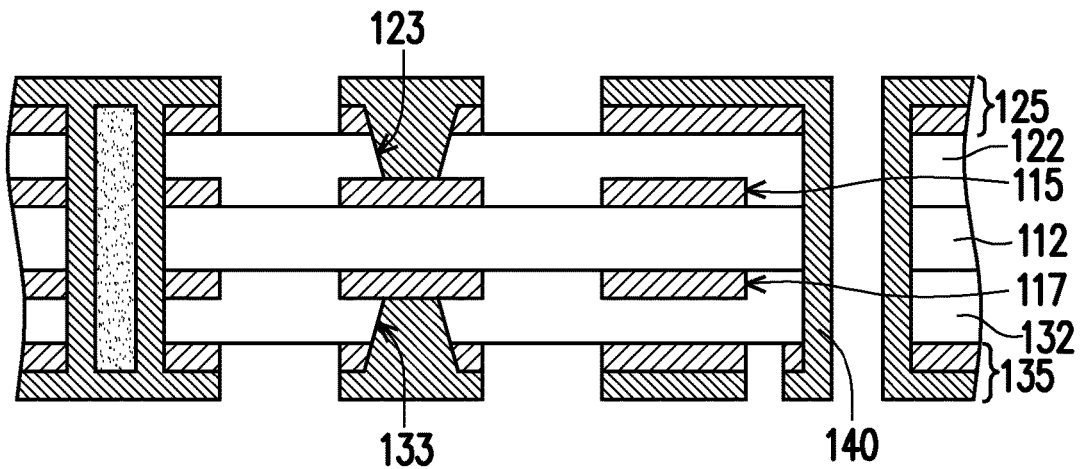

Next, referring to FIG. 1E and FIG. 1F both, a patterning process is performed on the heat-conducting material layer 140, the first copper layer 124, and the second copper layer 134, and a first circuit layer 125 and a second circuit layer 135 are formed on the first inner circuit layer 115 and the second inner circuit layer 117 respectively.

Figure 1G:
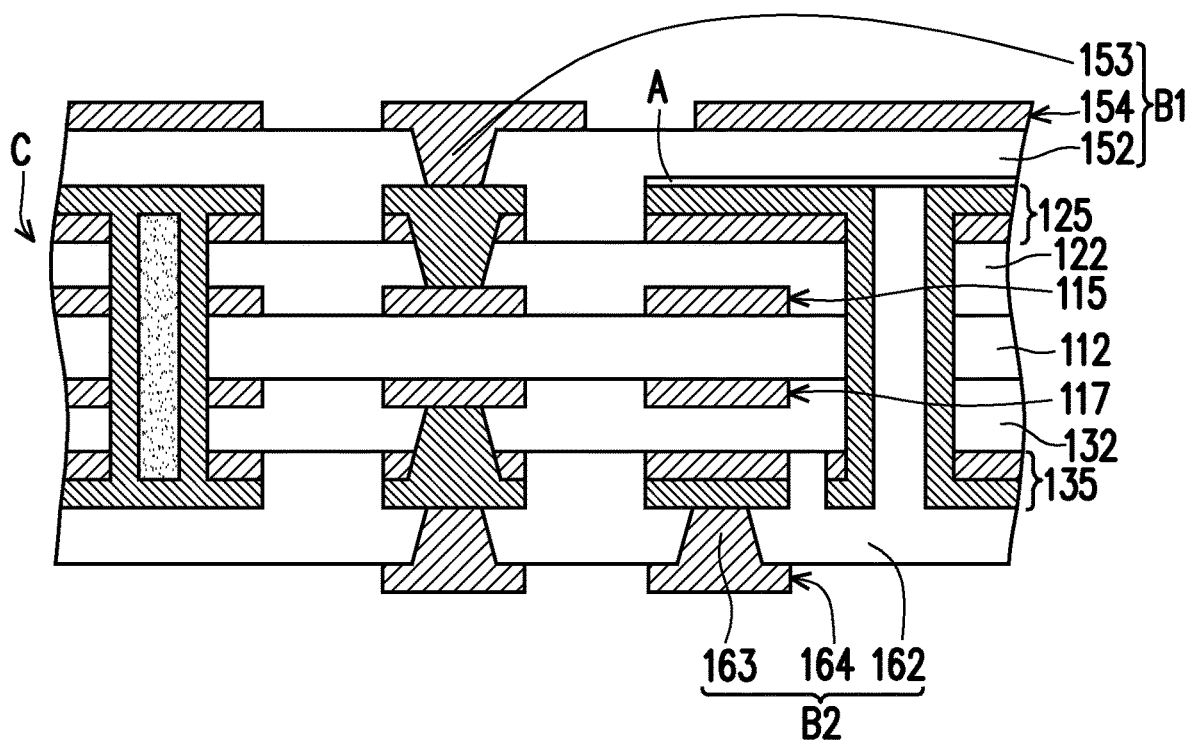

Next, referring to FIG. 1G, a release film A is disposed on part of the first circuit layer 125. Then, a first build-up structure B1 and a second build-up structure B2 are respectively formed on two opposite sides of the circuit substrate C by lamination, wherein the first build-up structure B1 and the second build-up structure B2 cover the circuit substrate C and the heat-conducting material layer 140, and completely fill the through via T2. Here, the first build-up structure B1 includes at least one dielectric layer (one dielectric layer 152 is shown schematically), at least one circuit layer (one circuit layer 154 is shown schematically), and at least one conductive blind via (one conductive blind via 153 is shown schematically). The dielectric layer 152 is located between the circuit layer 154 and the first circuit layer 125, and the circuit layer 154 is electrically connected to the first circuit layer 125 through the conductive blind via 153. The second build-up structure B2 includes at least one dielectric layer (one dielectric layer 162 is shown schematically), at least one circuit layer (one circuit layer 164 is shown schematically), and at least one conductive blind via (two conductive blind vias 163 are shown schematically). The dielectric layer 165 is located between the circuit layer 164 and the second circuit layer 135, and the circuit layer 164 is electrically connected to the second circuit layer 135 through the conductive blind via 163.

Figure 1H:
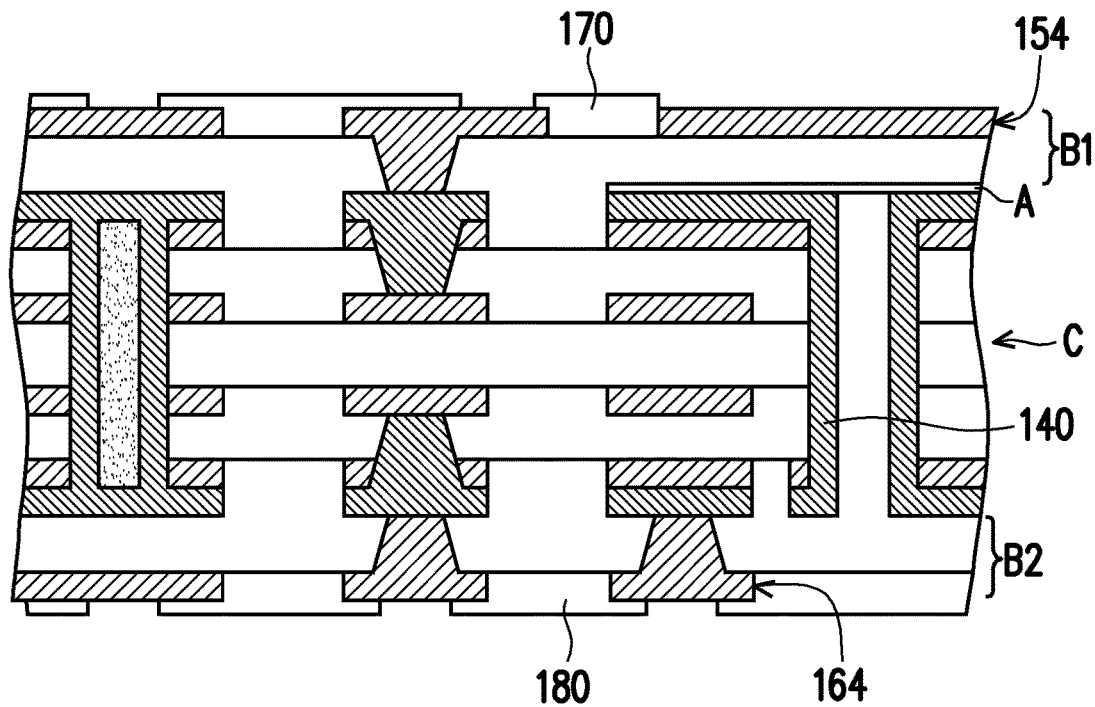

Afterwards, referring to FIG. 1H, a first insulating protection layer 170 and a second insulating protection layer 180 are formed in the first build-up structure B1 and the second build-up structure B2, wherein the first insulating protection layer 170 exposes part of the circuit layer 154 which serves as a pad, and the second insulating protection layer 180 exposes part of the circuit layer 164 which serves as a pad.

Figure 1I:
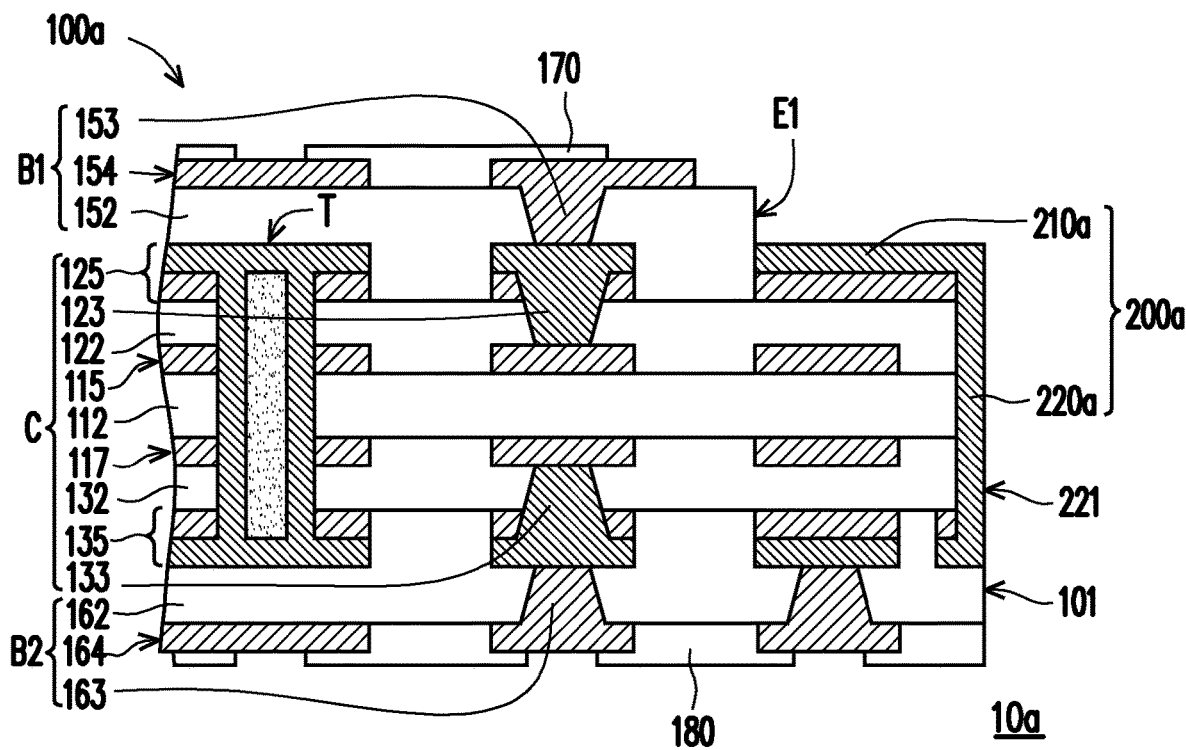
Figure 1J:
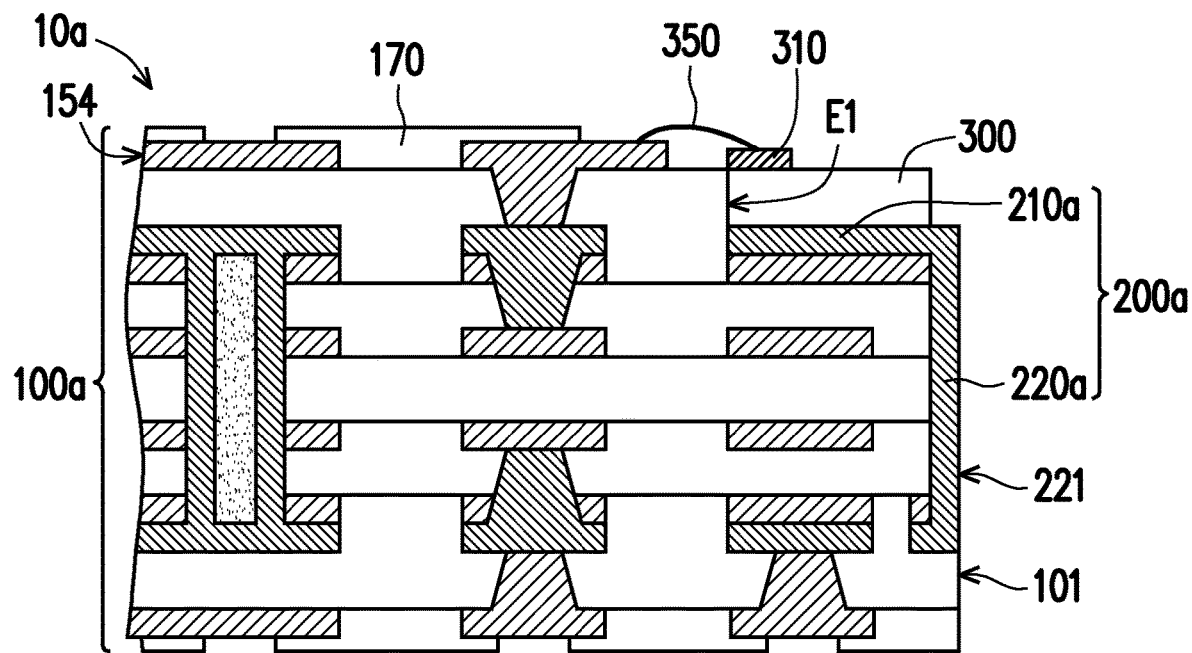
FIG. 1J and FIG. 1K are schematic cross-sectional views of a manufacturing method for packaging the heat-generating element on the package carrier of FIG. 1I.
Figure 1K:
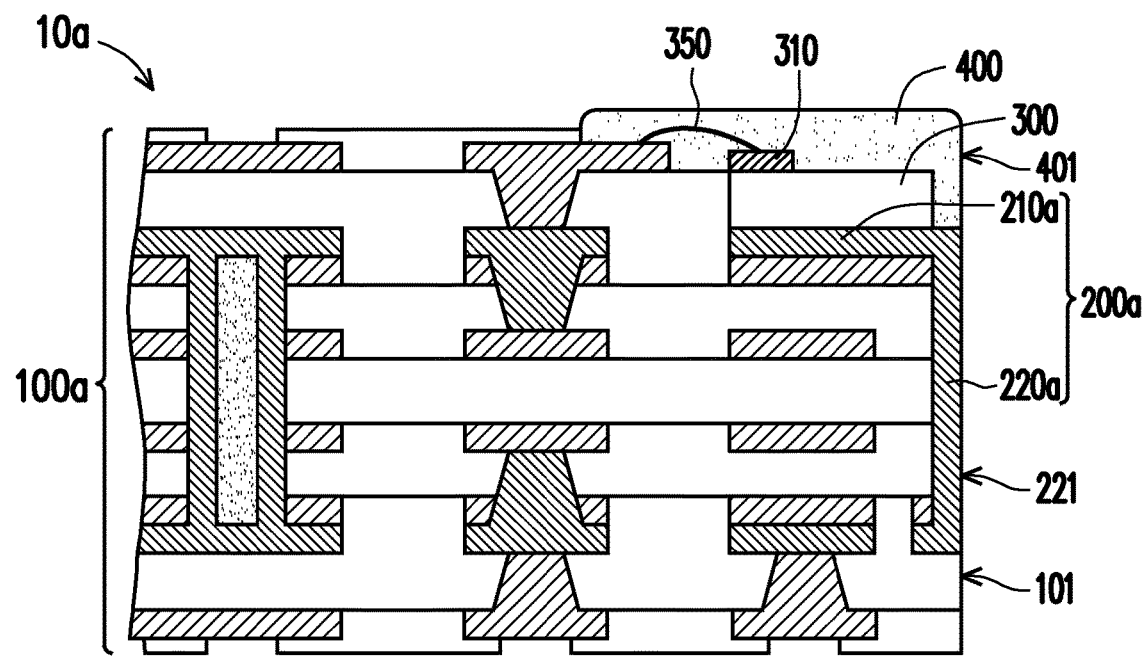

Finally, please refer to FIG. 1H and FIG. 1I both. Part of the first build-up structure B1, part of the circuit substrate C, part of the heat-conducting material layer 140 and part of the second build-up structure B2 are removed by means of routing and lifting off the release film A, and the remaining heat-conducting material layer 140 is exposed to define a heat-conducting element 200a and form a circuit structure layer 100a including a notch portion E1, thereby completing the production of the package carrier 10a.

Here, the heat-conducting element 200a includes a first heat-conducting portion 210a and a second heat-conducting portion 220a vertically connected to the first heat-conducting portion 210a, which means that the shape of the heat-conducting element 200a is, for example, an inverted L shape. It should be noted that the first heat-conducting portion 210a here is embodied by a combination of the first copper layer 124 (please refer to FIG. 1E) and the heat-conducting material layer 140. The position of the notch portion E1 substantially corresponds to the position of the release film A before being lifted off, wherein the notch portion E1 exposes the first heat-conducting portion 210a, and an outer surface 221 of the second heat-conducting portion 220a is aligned with a side surface 101 of the circuit structure layer 100a. In other words, the first heat-conducting portion 210a of this embodiment is embedded in the circuit structure layer 100a, and the second heat-conducting portion 220a is flatly attached to one side of the circuit structure layer 100a, and the outer surface 221 of the second heat-conducting portion 220a is aligned with the side surface 101 of the circuit structure layer 100a. It should be noted that the purpose of providing the release film A is to position and facilitate subsequent removal of the first build-up structure B1 located on the release film A.

In application, please refer to FIG. 1J, a heat-generating element 300 is arranged in the notch portion E1 of the circuit structure layer 100a of the package carrier 10a, wherein the heat-generating element 300 is located on the first heat-conducting portion 210a, and the heat-generating element 300 is electrically connected to the circuit structure layer 100a. Here, the pad 310 of the heat-generating element 300 is electrically connected to the circuit layer 154 exposed by the first insulating protection layer 170 through wire bonding 350. Certainly, in other embodiments, the heat-generating element 300 can also be electrically connected to the first circuit layer 154 through direct contacting, which still falls within the scope of the disclosure. In short, the heat-generating element 300 in this embodiment conducts heat through the first heat-conducting portion 210a, and the heat-generating element 300 conducts electricity through the circuit layer 154, thereby forming a thermoelectric separation structure.

Finally, referring to FIG. 1K, an encapsulant 400 is formed to cover the heat-generating element 300 and part of the circuit structure layer 100a, wherein a peripheral surface 401 of the encapsulant 400 is aligned with the outer surface 221 of the second heat-conducting portion 220a. At this stage, the production of a package structure 1a can be completed.

In terms of structure, please further refer to FIG. 1I. The package carrier 10a includes a circuit structure layer 100a and a heat-conducting element 200a. The circuit structure layer 100a includes a notch portion E1. The heat-conducting element 200a includes a first heat-conducting portion 210a and a second heat-conducting portion 220a vertically connected to the first heat-conducting portion 210a, which means that the shape of the heat-conducting element 200a is, for example, an inverted L shape. The notch portion E1 exposes the first heat-conducting portion 210a, and the outer surface 221 of the second heat-conducting portion 220a is aligned with the side surface 101 of the circuit structure layer 100a.

In detail, the circuit structure layer 100a of this embodiment includes the circuit substrate C, wherein the circuit substrate C includes the core layer 112, the first inner circuit layer 115, the second inner circuit layer 117, the first dielectric layer 122, the first circuit layer 125, the first conductive blind via 123, the second dielectric layer 132, the second circuit layer 135, and the second conductive blind via 133. The first inner circuit layer 115 is configured on one side of the core layer 112. The second inner circuit layer 117 is configured on the other side of the core layer 112. The first dielectric layer 122 covers the first inner circuit layer 115, and the first circuit layer 125 is disposed on the first dielectric layer 122. The first circuit layer 125 is electrically connected to the first inner circuit layer 115 through the first conductive blind via 123. The second dielectric layer 132 covers the second inner circuit layer 117, and the second circuit layer 135 is disposed on the second dielectric layer 132. The second circuit layer 135 is electrically connected to the second inner circuit layer 117 through the second conductive blind via 133. Here, the package carrier 10a further includes a conductive via T, which at least penetrates the circuit substrate C, and is electrically connected to the first circuit layer 125, the first inner circuit layer 115, the second inner circuit layer 117, and the second circuit 135. Specifically, the first heat-conducting portion 210a of the heat-conducting element 200a and the first circuit layer 125 of this embodiment are located on the same plane, and the material of the heat-conducting element 200a is copper, for example.

Furthermore, the circuit structure layer 100a of this embodiment further includes a first build-up structure B1 and a second build-up structure B2. The first build-up structure B1 is disposed on the first circuit layer 125 of the circuit substrate C and is electrically connected to the first circuit layer 125. The first build-up structure B1 includes a notch portion E1. The second build-up structure B2 is disposed on the second circuit layer 135 of the circuit substrate C and is electrically connected to the second circuit layer 135. Here, the first build-up structure B1 includes a dielectric layer 152, a circuit layer 154, and a conductive blind via 153, wherein the dielectric layer 152 is located between the circuit layer 154 and the first circuit layer 125, and the circuit layer 154 is electrically connected to the first circuit layer 125 through the conductive blind via 153. The second build-up structure B2 includes a dielectric layer 162, a circuit layer 164, and a conductive blind via 163. The dielectric layer 162 is located between the circuit layer 164 and the second circuit layer 135, and the circuit layer 164 is electrically connected to the second circuit layer 135 through the conductive blind via 163.

In addition, the circuit structure layer 100a of this embodiment further includes a first insulating protection layer 170 and a second insulating protection layer 180. The first insulating protection layer 170 is disposed on the first build-up structure B1 and exposes part of the first build-up structure B1. The second insulating protection layer 180 is disposed on the second build-up structure B2 and exposes part of the second circuit layer 164 of the second build-up structure B2.

In short, the first heat-conducting portion 210a of the heat-conducting element 200a of this embodiment is embedded in the circuit structure layer 100a, and the heat-generating element 300 can be directly disposed on the first heat-conducting portion 210a or fixed on the first heat-conducting portion 210a through an insulating adhesive layer (not shown), such that the heat generated by the heat-generating element 300 can be transferred to the outside through the second heat-conducting portion 220a. Furthermore, since the second heat-conducting portion 220a of the heat-conducting element 200a is attached to one side of the circuit structure layer 100a and is exposed to the outside, thus increasing the contact area with the outside, and therefore the heat generated by the heat-generating element 300 can be effectively and quickly transferred to the outside; accordingly, the package carrier 10a of this embodiment can have an improved heat dissipation efficiency. In addition, the heat-generating element 300 conducts electricity through the first circuit layer 154 of the first build-up structure B1, and the heat-generating element 300 conducts heat through the heat-conducting element 200a, thereby forming a thermo-electric separation structure.

It must be noted here that the following embodiments adopt the element numbers and part of the content of the foregoing embodiments, wherein the same numbers are adopted to represent the same or similar elements, and the description of the same technical content is omitted. The description of the omitted parts can be derived from the foregoing embodiments, and no further description will be narrated herein.

Figure 2A:
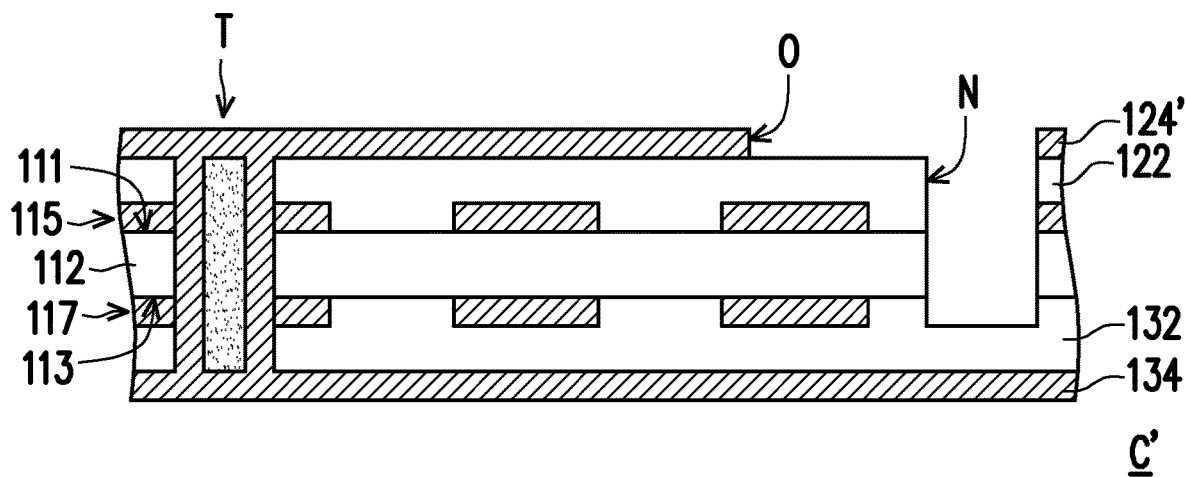
FIG. 2A to FIG. 2F are schematic views of a manufacturing method of a package carrier according to an embodiment of the disclosure.

FIG. 2A to FIG. 2F are schematic views of a manufacturing method of a package carrier according to an embodiment of the disclosure. FIG. 2G to FIG. 2I are schematic cross-sectional views and a perspective view of a manufacturing method for packaging the heat-generating element on the package carrier of FIG. 2F. Regarding the manufacturing method of the package carrier in this embodiment, first of all, like the steps in FIG. 1A to FIG. 1D, please refer to FIG. 2A, a core layer 112, a first inner circuit layer 115, and a second inner circuit layer 117 are provided, wherein the first inner circuit layer 115 and the second inner circuit layer 117 are respectively located on two opposite surfaces 111 and 113 of the core layer 112. Next, a first dielectric layer 122 and a first copper layer 124' located on the first dielectric layer 122 are formed on the first inner circuit layer 115, and a second dielectric layer 132 and a second copper layer 134 located on the second dielectric layer 132 are formed on the second inner circuit layer 117. An opening O penetrating the first copper layer 124' as well as a recess N penetrating the first dielectric layer 122, the core layer 112 and part of the second dielectric layer 132 are formed, wherein the depth of the recess N is greater than the depth of the opening O, and the diameter of the opening O is larger than that of the recess N. At this stage, the circuit substrate C' has been provided, wherein the circuit substrate C' includes a first copper layer 124' having an opening O and a recess N communicating with the opening O. Here, as shown in FIG. 2A, the circuit substrate C' further has a conductive via T to be electrically connected to the first copper layer 124', the first inner circuit layer 115, the second inner circuit layer 117, and the second copper layer 134.

Figure 2B:
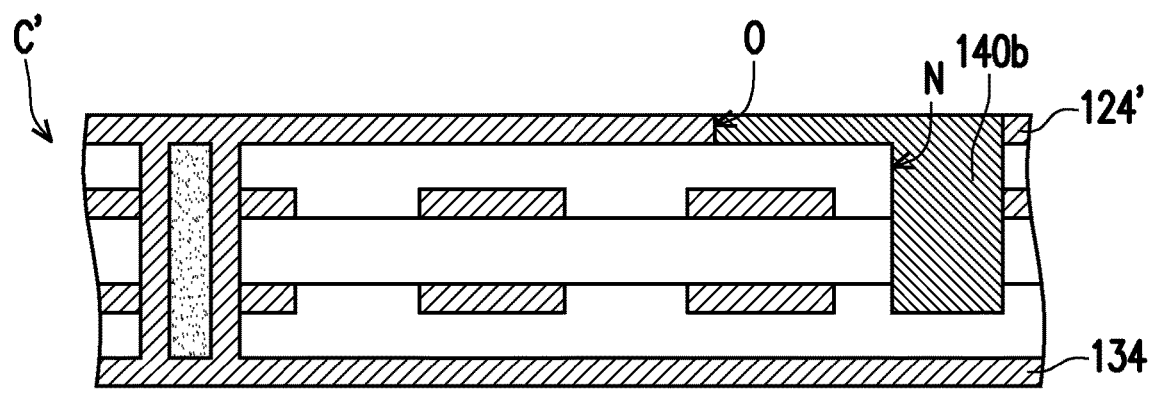

Next, referring to FIG. 2B, a heat-conducting material layer 140b is printed on the circuit substrate C', wherein the heat-conducting material layer 140b completely fills the recess N and the opening O and is connected to the first copper layer 124'. Here, the material of the heat-conducting material layer 140b is, for example, a conductive metal adhesive or a heat-conducting metal adhesive, which is made by transient liquid phase sintering (TLPS) coating, capable of achieving electrical and heat conduction effects, adaptable for bonding with any metal materials, and is not converted back to the liquid state due to heat.

Figure 2C:
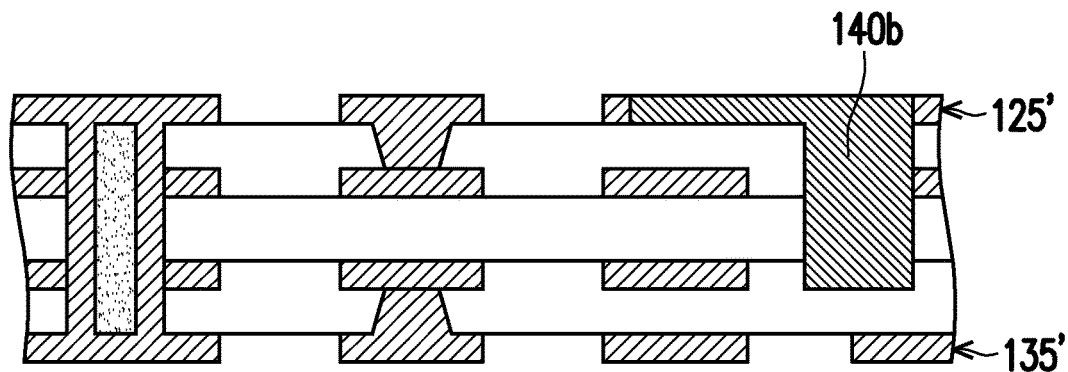

Next, referring to FIG. 2B and FIG. 2C both, a patterning process is performed on the first copper layer 124' and the second copper layer 134 to form a first circuit layer 125' and a second circuit layer 135', respectively, wherein the heat-conducting material layer 140b is directly connected to the first circuit layer 125'.

Figure 2D:
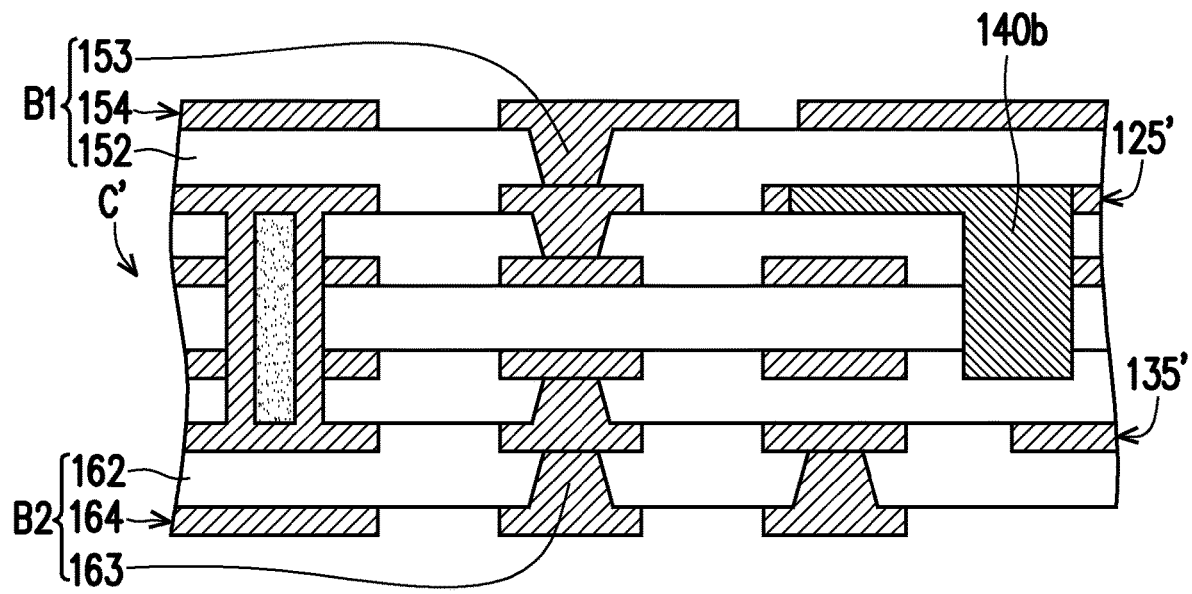

Next, referring to FIG. 2D, a first build-up structure B1 and a second build-up structure B2 are respectively formed on two opposite sides of the circuit substrate C'. The first build-up structure B1 and the second build-up structure B2 cover the circuit substrate C' and the heat-conducting material layer 140b. Here, the first build-up structure B1 includes at least one dielectric layer (one dielectric layer 152 is shown schematically), at least one circuit layer (one circuit layer 154 is shown schematically), and at least one conductive blind via (one conductive blind via 153 is shown schematically). The dielectric layer 152 is located between the circuit layer 154 and the first circuit layer 125', and the circuit layer 154 is electrically connected to the first circuit layer 125' through the conductive blind via 153. The second build-up structure B2 includes at least one dielectric layer (one dielectric layer 162 is shown schematically), at least one circuit layer (one circuit layer 164 is shown schematically), and at least one conductive blind via (two conductive blind vias 163 are shown schematically). The dielectric layer 165 is located between the circuit layer 164 and the second circuit layer 135', and the circuit layer 164 is electrically connected to the second circuit layer 135' through the conductive blind via 163.

Figure 2E:
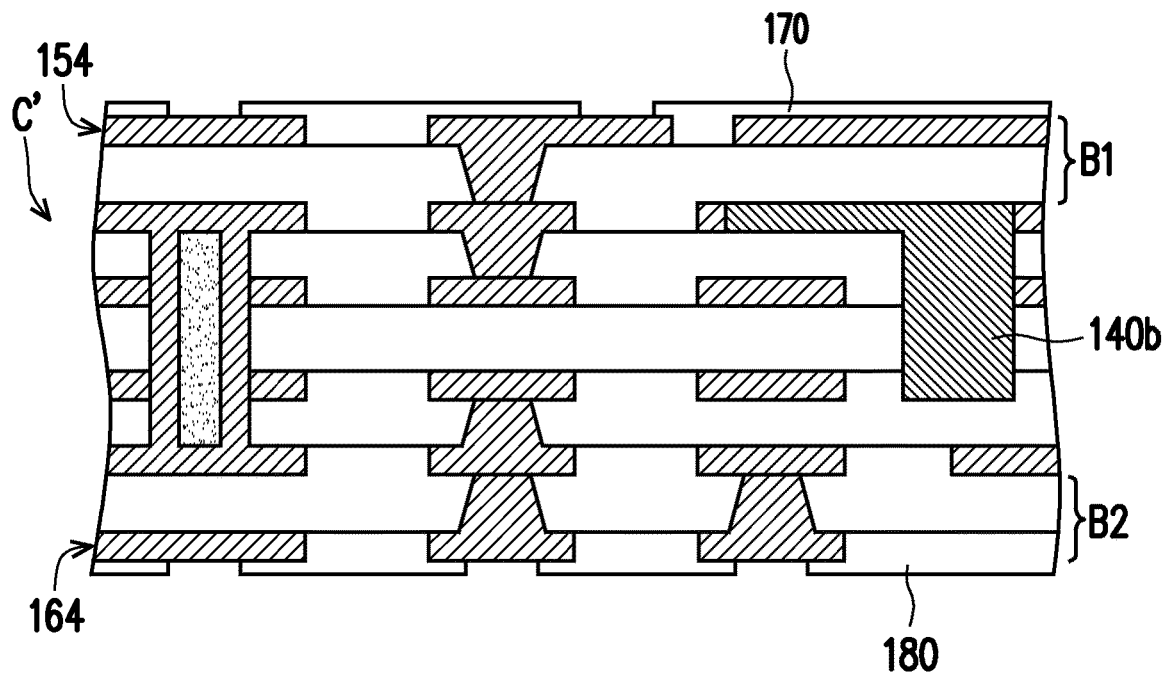

Afterwards, referring to FIG. 2E, a first insulating protection layer 170 and a second insulating protection layer 180 are formed on the first build-up structure B1 and the second build-up structure B2, wherein the first insulating protection layer 170 exposes part of the circuit layer 154 which serves as a pad, and the second insulating protection layer 180 exposes part of the circuit layer 164 which serves as a pad.

Figure 2F:
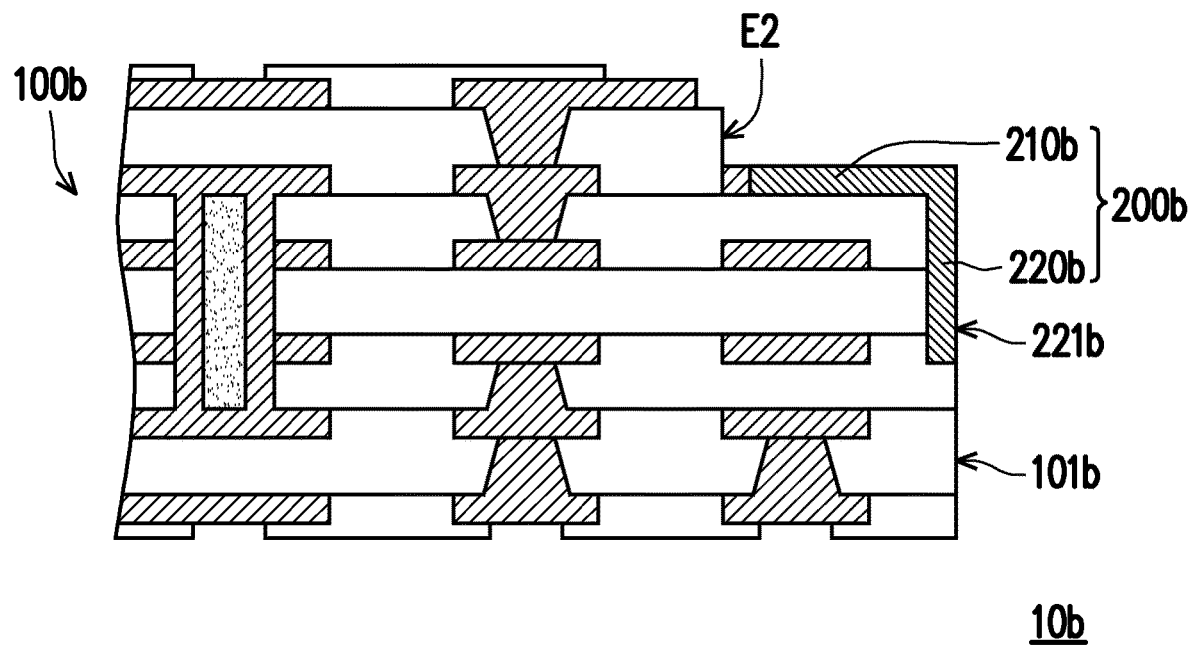
Figure 2G:
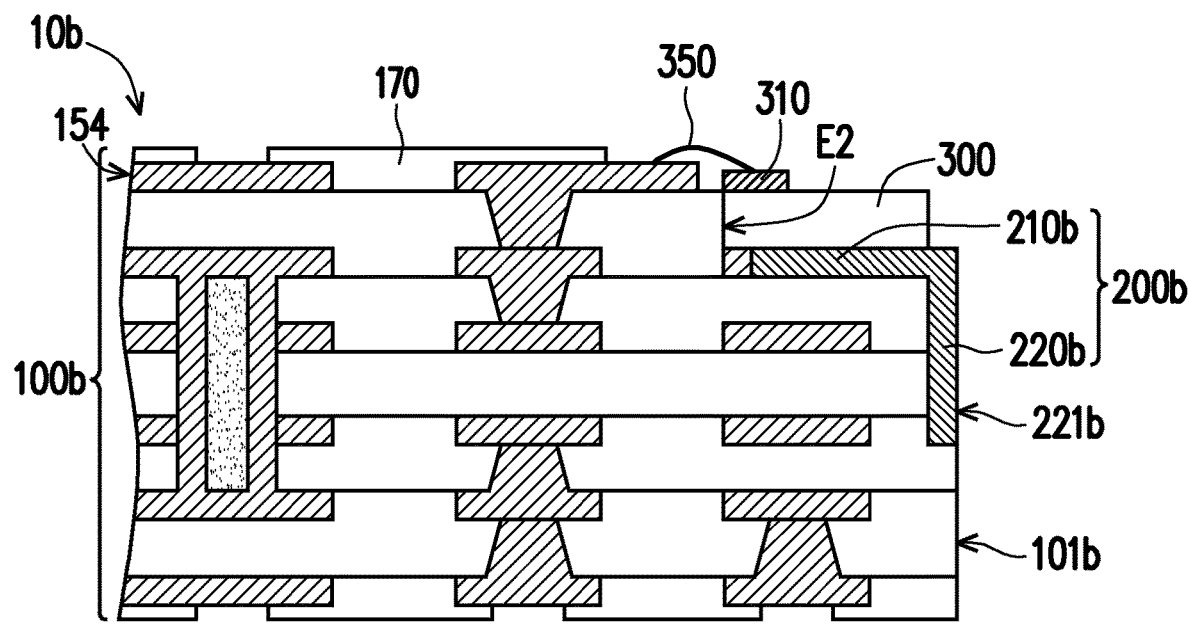
FIG. 2G to FIG. 2I are schematic cross-sectional views and a perspective view of a manufacturing method for packaging the heat-generating element on the package carrier of FIG. 2F.
Figure 2H:
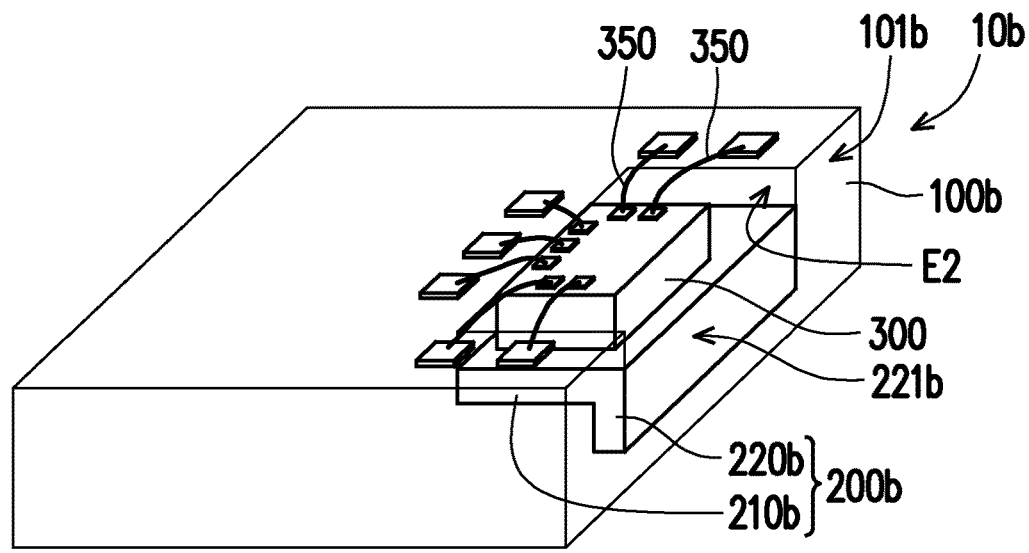
Figure 2I:
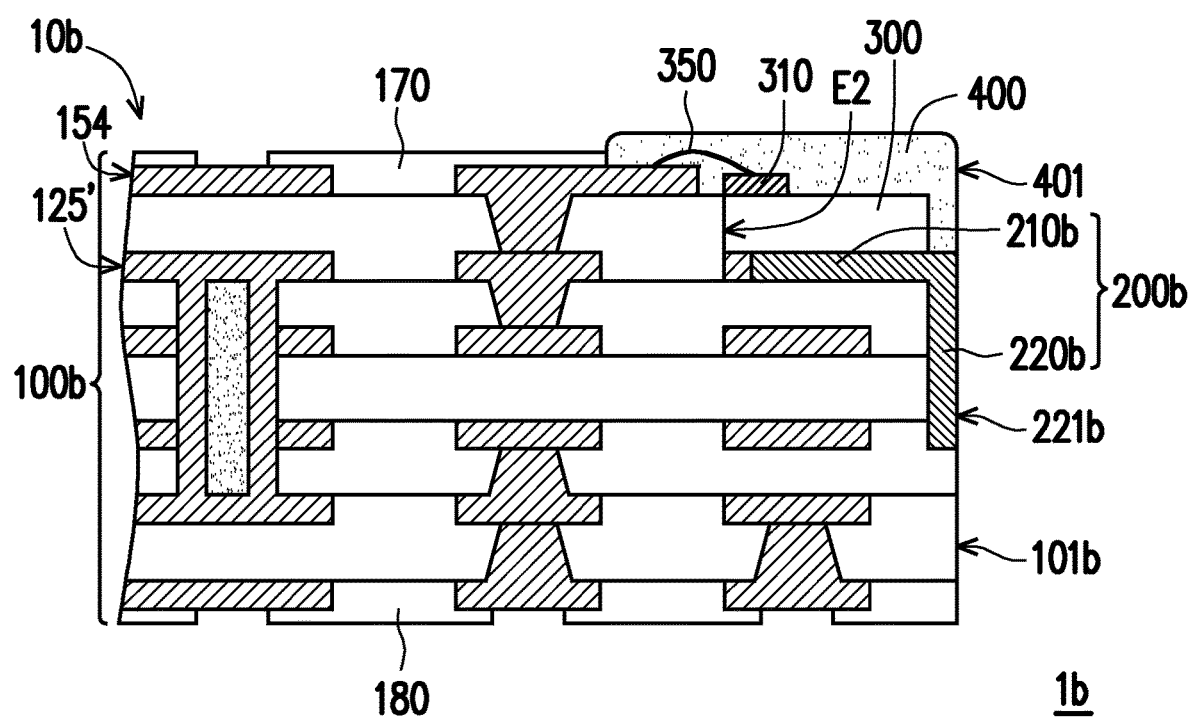

Finally, please refer to FIG. 2E and FIG. 2F both, part of the first build-up structure B1, part of the circuit substrate C', part of the heat-conducting material layer 140b, and part of the second build-up layer structure B2 are removed by means of routing, and the remaining heat-conducting material layer 140b is exposed to define a heat-conducting element 200b and form a circuit structure layer 100b including a notch portion E2, thereby completing the fabrication of the package carrier 10b. Here, the heat-conducting element 200b includes a first heat-conducting portion 210b and a second heat-conducting portion 220b vertically connected to the first heat-conducting portion 210b, which means that the shape of the heat-conducting element 200b is, for example, an inverted L shape. The notch portion E2 exposes the first heat-conducting portion 210b, and the outer surface 221b of the second heat-conducting portion 220b is aligned with the side surface 101b of the circuit structure layer 100b.

In application, please refer to FIG. 2G and FIG. 2H both. The heat-generating element 300 is arranged in the notch portion E2 of the circuit structure layer 100b of the package carrier 10b. The heat-generating element 300 is located on the first heat-conducting portion 210b and the heat-generating element 300 is electrically connected to the circuit structure layer 100b. Here, the pad 310 of the heat-generating element 300 is electrically connected to the circuit layer 154 exposed by the first insulating protection layer 170 through wire bonding 350.

Finally, referring to FIG. 2I, an encapsulant 400 is formed to cover the heat-generating element 300 and part of the circuit structure layer 100b, wherein a peripheral surface 401 of the encapsulant 400 is aligned with the outer surface 221 of the second heat-conducting portion 220b, thereby completing the fabrication of a package structure 1b.

Please further refer to FIG. 1I and FIG. 2F both. The package carrier 10b of this embodiment is similar to the package carrier 10a mentioned above. The difference between the two is that: the first heat-conducting portion 210b of the heat-conducting element 200b of the package carrier 10b in the embodiment directly contacts the first circuit layer 125', and the material of the heat-conducting element 200b is, for example, conductive metal adhesive or heat-conducting metal adhesive. That is to say, the material of the heat-conducting member 220b of this embodiment is different from the material of the circuit layer (for example, copper), but it can achieve electrical and heat conduction effects simultaneously.

In summary, in the package carrier of the disclosure, the heat-conducting element includes a first heat-conducting portion and a second heat-conducting portion vertically connected to the first heat-conducting portion. That is, the first heat-conducting portion of the heat-conducting element is embedded in the circuit structure layer, and the second heat-conducting portion is attached to one side of the circuit structure layer and is exposed to the outside, thereby increasing the contact area with the outside. Therefore, when the heat-generating element is arranged on the first heat-conducting portion of the package carrier, the outer surface of the second heat-conducting portion can be aligned with the side surface of the circuit structure layer and the peripheral surface of the encapsulant, thus the heat generated by the heat-generating element can be effectively and quickly transferred to the outside, so that the package carrier of the disclosure can have an improved heat dissipation efficiency.

Although the present disclosure has been disclosed in the above embodiments, it is not intended to limit the present disclosure, and those skilled in the art can make some modifications and refinements without departing from the spirit and scope of the disclosure. Therefore, the scope of the present disclosure is subject to the definition of the scope of the appended claims.

What is claimed is:

1. A package carrier, comprising:
   a circuit structure layer comprising a notch portion and a first circuit layer; and
   a heat-conducting element comprising a first heat-conducting portion and a second heat-conducting portion perpendicularly connected to the first heat-conducting portion, wherein a shape of the heat-conducting element is an inverted L shape, the notch portion has a bottom surface, the first circuit layer has a first surface contacting the bottom surface and a second surface relatively far away from the bottom surface, the first heat-conducting portion has a third surface contacting the bottom surface and a fourth surface relatively far away from the bottom surface, and the fourth surface of the first heat-conducting portion and the second surface of the first circuit layer are coplanar, the first heat-conducting portion and the first circuit layer are located on a same plane, and the first heat-conducting portion directly contacts the first circuit layer, the notch portion exposes the first heat-conducting portion, and an outer surface of the second heat-conducting portion is aligned with a side surface of the circuit structure layer.

2. The package carrier according to claim 1, wherein the circuit structure layer comprises a circuit substrate, and the circuit substrate comprises:
   a core layer;
   a first inner circuit layer arranged on one side of the core layer;
   a second inner circuit layer arranged on an other side of the core layer;
   a first dielectric layer covering the first inner circuit layer;
   the first circuit layer disposed on the first dielectric layer;
   at least one first conductive blind via, wherein the first circuit layer is electrically connected to the first inner circuit layer through the at least one first conductive blind via;
   a second dielectric layer covering the second inner circuit layer;
   a second circuit layer disposed on the second dielectric layer; and
   at least one second conductive blind via, wherein the second circuit layer is electrically connected to the second inner circuit layer through the at least one second conductive blind via.

3. The package carrier according to claim 2, wherein the circuit structure layer further comprises:
   a first build-up structure disposed on the first circuit layer of the circuit substrate and electrically connected to the first circuit layer, wherein the first build-up structure comprises the notch portion; and
   a second build-up structure disposed on the second circuit layer of the circuit substrate and electrically connected to the second circuit layer.

4. The package carrier according to claim 3, wherein the first build-up structure comprises at least one dielectric layer, at least one circuit layer, and at least one conductive blind via, the at least one dielectric layer is located between the at least one circuit layer and the first circuit layer, and the at least one circuit layer is electrically connected to the first circuit layer through the at least one conductive blind via.

5. The package carrier according to claim 3, wherein the second build-up structure comprises at least one dielectric layer, at least one circuit layer, and at least one conductive blind via, the at least one dielectric layer is located between the at least one circuit layer and the second circuit layer, and the at least one circuit layer is electrically connected to the second circuit layer through the at least one conductive blind via.

6. The package carrier according to claim 3, wherein the circuit structure layer further comprises:
   a first insulating protection layer disposed on the first build-up structure and exposing a part of the first build-up structure; and
   a second insulating protection layer disposed on the second build-up structure and exposing a part of the second build-up structure.

7. The package carrier according to claim 2, wherein the circuit structure layer further comprises:
   a conductive via, which at least penetrates the circuit substrate and is electrically connected to the first circuit layer, the first inner circuit layer, the second inner circuit layer and the second circuit layer.

8. The package carrier according to claim 1, wherein a material of the heat-conducting element comprises copper, a conductive metal adhesive or a heat-conducting metal adhesive.

* * * * *